(12) United States Patent
Shen et al.

(10) Patent No.: US 11,774,392 B1
(45) Date of Patent: Oct. 3, 2023

(54) CHIP CRACK DETECTION STRUCTURE

(71) Applicant: United Microelectronics Corp., Hsinchu (TW)

(72) Inventors: Tsong-Lin Shen, Kaohsiung (TW); Tsung-Yu Yang, Chiayi County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 17/701,689

(22) Filed: Mar. 23, 2022

(30) Foreign Application Priority Data

Mar. 2, 2022 (TW) .................................. 111107522

(51) Int. Cl.
*G01N 27/24* (2006.01)
*G01R 31/28* (2006.01)

(52) U.S. Cl.
CPC ......... *G01N 27/24* (2013.01); *G01R 31/2831* (2013.01)

(58) Field of Classification Search
CPC .. G01N 27/24; G01R 31/2831; H01L 27/115; H01L 21/66; H01L 23/00; H01L 29/423; H01L 22/34; H01L 23/562; H10B 43/27; H10B 43/35; H10B 43/50
USPC ........................................................ 324/663
See application file for complete search history.

(56) References Cited

U.S. PATENT DOCUMENTS

| 10,998,274 B2 | 5/2021 | Pan et al. |
| 2007/0023915 A1* | 2/2007 | Jao .................. H01L 23/562 |
| | | 257/758 |
| 2009/0321734 A1 | 12/2009 | Ogawa et al. |
| 2017/0103929 A1* | 4/2017 | Lee .................. H01L 23/562 |

FOREIGN PATENT DOCUMENTS

JP        2009290132 A  * 12/2009

OTHER PUBLICATIONS

Translation of JP2009290132A Semiconductor Device and Crack Detecting Method for Semiconductor Device (Year: 2009).*

* cited by examiner

*Primary Examiner* — Jermele M Hollington
*Assistant Examiner* — Courtney G McDonnough
(74) *Attorney, Agent, or Firm* — JCIPRNET (57) ABSTRACT

A chip crack detection structure, including a substrate, a first chip crack detection ring, a second chip crack detection ring, and a seal ring, is provided. The first chip crack detection ring includes multiple first conductive layers stacked over the substrate and electrically connected to each other. A bottom surface of a lowermost conductive layer among the first conductive layers is not in contact with any plug. The second chip crack detection ring surrounds the first chip crack detection ring. The second chip crack detection ring includes multiple second conductive layers stacked over the substrate and electrically connected to each other. A bottom surface of a lowermost conductive layer among the second conductive layers is not in contact with any plug. The seal ring surrounds the second chip crack detection ring. The seal ring includes multiple third conductive layers stacked over the substrate and electrically connected to each other.

19 Claims, 6 Drawing Sheets

CHIP CRACK DETECTION STRUCTURE

CROSS-REFERENCE TO RELATED APPLICATION

This application claims the priority benefit of Taiwan application serial no. 111107522, filed on Mar. 2, 2022. The entirety of the above-mentioned patent application is hereby incorporated by reference herein and made a part of this specification.

BACKGROUND

Technical Field

The disclosure relates to a semiconductor structure, and particularly relates to a chip crack detection structure.

Description of Related Art

The current chip crack detection structure monitors whether a dielectric layer in a chip is cracked by measuring resistance. However, such chip crack detection structure has issues of low sensitivity, short lifetime, complicated circuit, and large footprint.

SUMMARY

The disclosure provides a chip crack detection structure, which can increase sensitivity and lifetime, and can reduce circuit complexity and footprint.

The disclosure provides a chip crack detection structure, including a substrate, a first chip crack detection ring, a second chip crack detection ring, and a seal ring. The first chip crack detection ring includes multiple first conductive layers. The first conductive layers are stacked over the substrate and are electrically connected to each other. A bottom surface of a lowermost conductive layer among the first conductive layers is not in contact with any plug. The second chip crack detection ring surrounds the first chip crack detection ring. The second chip crack detection ring includes multiple second conductive layers. The second conductive layers are stacked over the substrate and are electrically connected to each other. A bottom surface of a lowermost conductive layer among the second conductive layers is not in contact with any plug. The seal ring surrounds the second chip crack detection ring. The seal ring includes multiple third conductive layers. The third conductive layers are stacked over the substrate and are electrically connected to each other.

According to an embodiment of the disclosure, the chip crack detection structure may further include a dielectric layer. The dielectric layer is located on the substrate. The first chip crack detection ring, the second chip crack detection ring, and the seal ring are located in the dielectric layer.

According to an embodiment of the disclosure, in the chip crack detection structure, the first chip crack detection ring and the second chip crack detection ring are not electrically connected to the substrate.

According to an embodiment of the disclosure, in the chip crack detection structure, the seal ring may be electrically connected to the substrate.

According to an embodiment of the disclosure, in the chip crack detection structure, the first chip crack detection ring may further include multiple first plugs. The first conductive layers and the first plugs are alternately stacked. The first conductive layers may be electrically connected to each other by the first plugs. The second chip crack detection ring further includes multiple second plugs. The second conductive layers and the second plugs are alternately stacked. The second conductive layers may be electrically connected to each other by the second plugs.

According to an embodiment of the disclosure, in the chip crack detection structure, a distance between two adjacent first plugs located between two adjacent first conductive layers may be 2 micrometers ($\mu m$) to 16.4 $\mu m$.

According to an embodiment of the disclosure, in the chip crack detection structure, a distance between two adjacent second plugs located between two adjacent second conductive layers may be 2 $\mu m$ to 16.4 $\mu m$.

According to an embodiment of the disclosure, in the chip crack detection structure, a minimum distance between the first plug and the second plug may be 1 to 3 times a minimum plug distance specified by a design rule.

According to an embodiment of the disclosure, in the chip crack detection structure, a line width of the first conductive layer may be 1 to 3 times a minimum line width specified by a design rule.

According to an embodiment of the disclosure, in the chip crack detection structure, a line width of the second conductive layer may be 1 to 3 times a minimum line width specified by a design rule.

According to an embodiment of the disclosure, in the chip crack detection structure, a minimum distance between the first conductive layer and the second conductive layer is 1 to 3 times a minimum conductive layer distance specified by a design rule.

According to an embodiment of the disclosure, in the chip crack detection structure, the seal ring may further include multiple plugs. The third conductive layers and the plugs are alternately stacked. The third conductive layers are electrically connected to each other by the plugs.

According to an embodiment of the disclosure, in the chip crack detection structure, a bottom surface of a lowermost conductive layer among the third conductive layers may be in contact with a lowermost plug among the plugs.

According to an embodiment of the disclosure, in the chip crack detection structure, the lowermost plug among the plugs may be electrically connected to the substrate.

According to an embodiment of the disclosure, in the chip crack detection structure, the lowermost plug among the plugs may be electrically connected to a gate layer. The gate layer is located between the lowermost plug among the plugs and the substrate.

According to an embodiment of the disclosure, in the chip crack detection structure, the substrate may have an element region. The first chip crack detection ring may surround the element region.

According to an embodiment of the disclosure, in the chip crack detection structure, the element region may include an embedded high voltage (eHV) element region.

According to an embodiment of the disclosure, in the chip crack detection structure, the seal ring may be electrically connected to a negative voltage source.

According to an embodiment of the disclosure, in the chip crack detection structure, one of the first conductive layers may have a discontinuous structure and may have an opening. One of the second conductive layers may have an extension. The extension may pass through the opening and extend into the element region.

According to an embodiment of the disclosure, the chip crack detection structure may further include a chip crack detection circuit. The first chip crack detection ring and the second chip crack detection ring may be electrically connected to the chip crack detection circuit.

Based on the above, the chip crack detection structure of the disclosure includes the first chip crack detection ring and the second chip crack detection ring, the bottom surface of the lowermost conductive layer among the first conductive layers of the first chip crack detection ring is not in contact with any plug, and the bottom surface of the lowermost conductive layer among the second conductive layers of the second chip crack detection ring is not in contact with any plug. Therefore, the chip crack detection structure may monitor whether the dielectric layer in the chip is cracked by measuring the capacitance between the first chip crack detection ring and the second chip crack detection ring, so that the sensitivity and lifetime of the chip crack detection structure can be increased, and the circuit complexity and footprint of the chip crack detection structure can be reduced.

In order for the features and advantages of the disclosure to be more comprehensible, the following specific embodiments are described in detail in conjunction with the drawings.

DETAILED DESCRIPTION OF DISCLOSED EMBODIMENTS

The following embodiments will be described in detail with reference to the accompanying drawings, but the provided embodiments are not intended to limit the scope covered by the disclosure. In order to facilitate understanding, the same components will be described with the same reference numerals in the following description. In addition, the drawings are for illustrative purposes only and are not drawn to scale. Additionally, features in the top view, the cross-sectional view, and the perspective view are not drawn to the same scale. In fact, the dimensions of the various features may be arbitrarily increased or decreased for clarity of discussion.

Figure 1A:
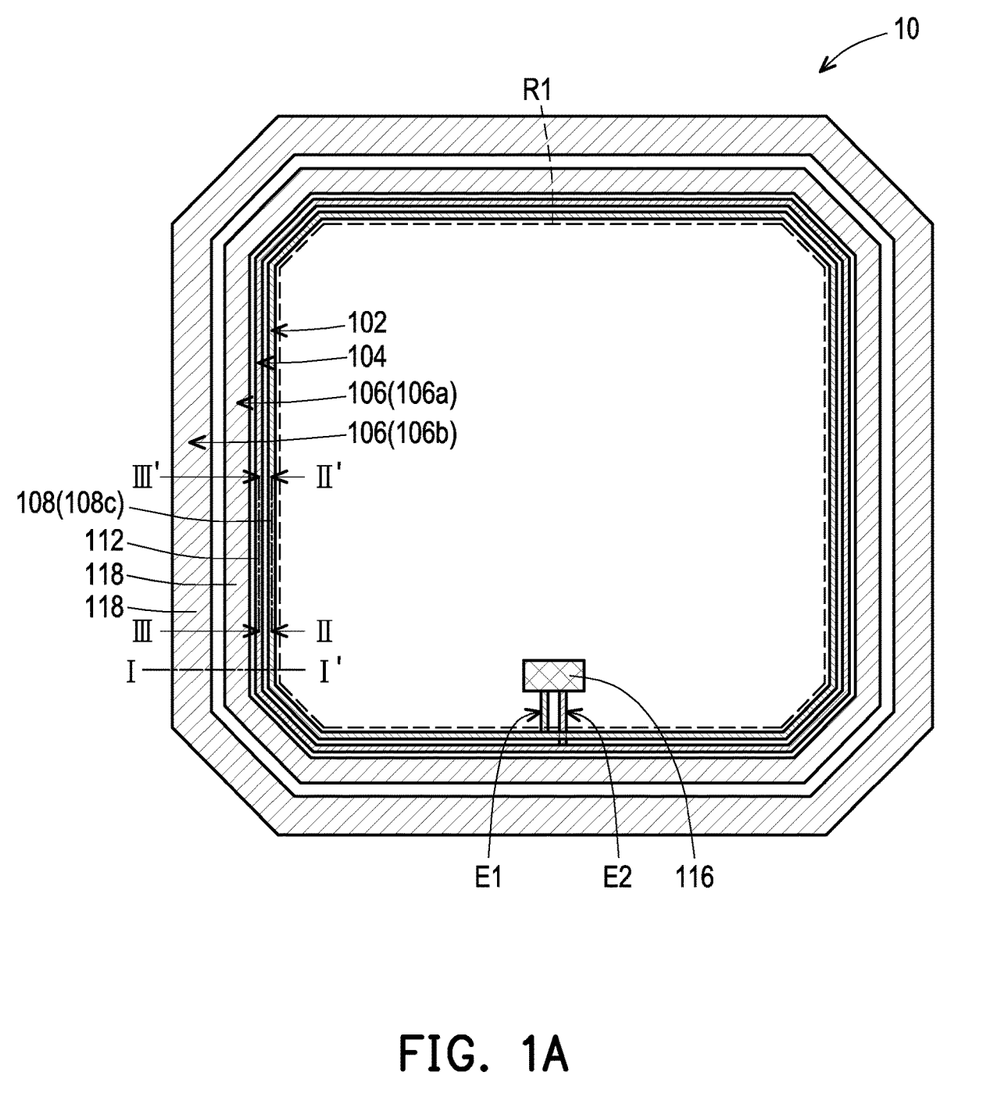
FIG. 1A is a top view of a chip crack detection structure according to some embodiments of the disclosure.
Figure 1B:
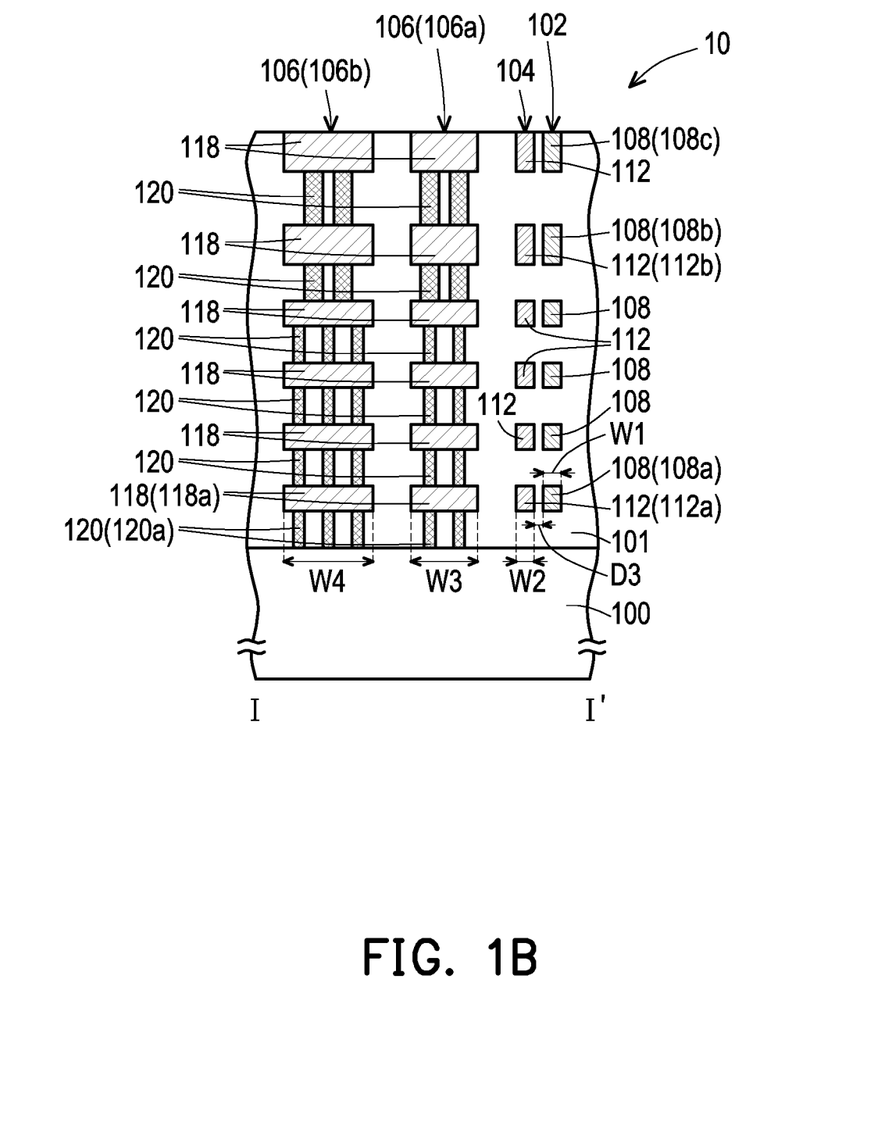
FIG. 1B is a cross-sectional view along a section line I-I' in FIG. 1A.
Figure 1C:
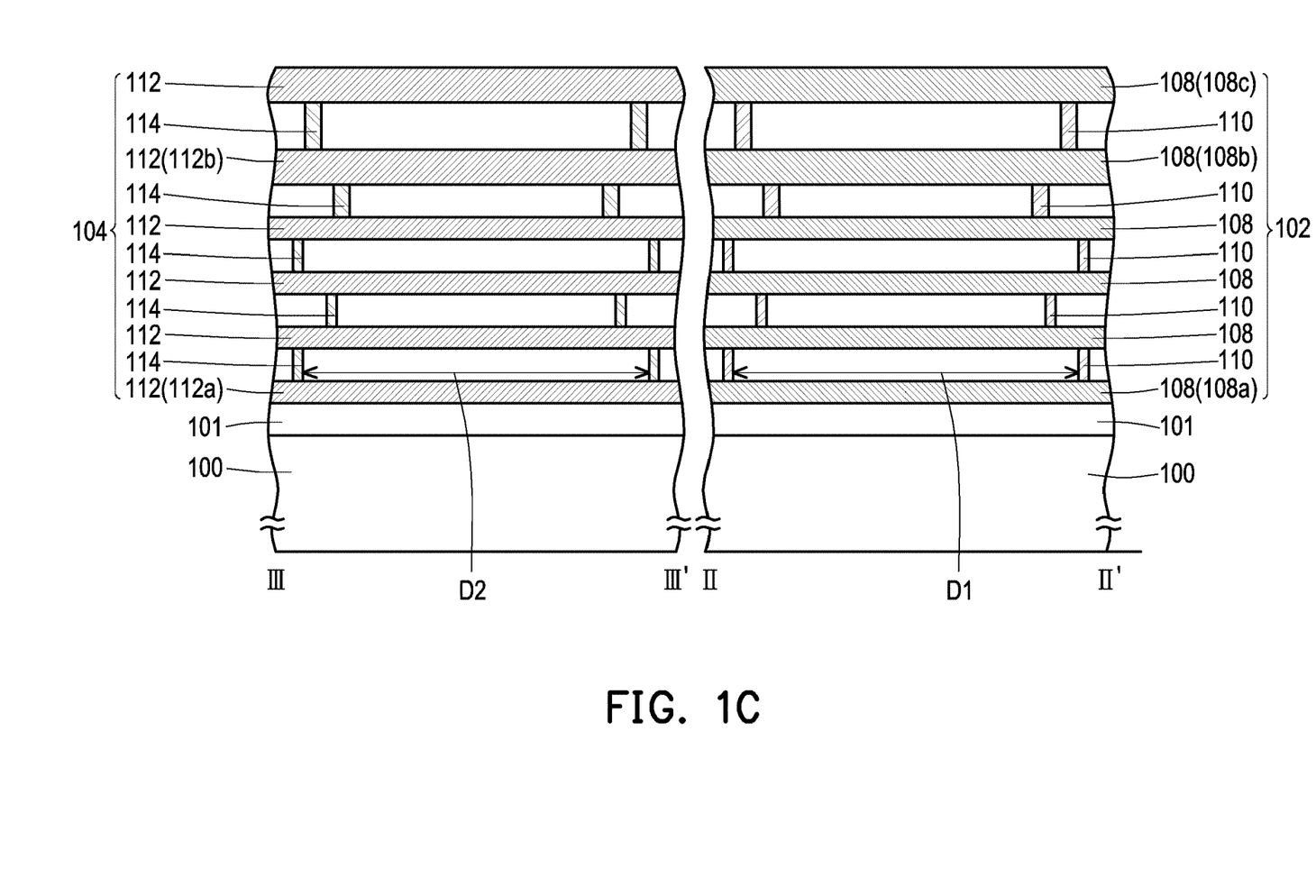
FIG. 1C is a cross-sectional view along a section line II-II' and a section line III-III' in FIG. 1A.
Figure 1D:
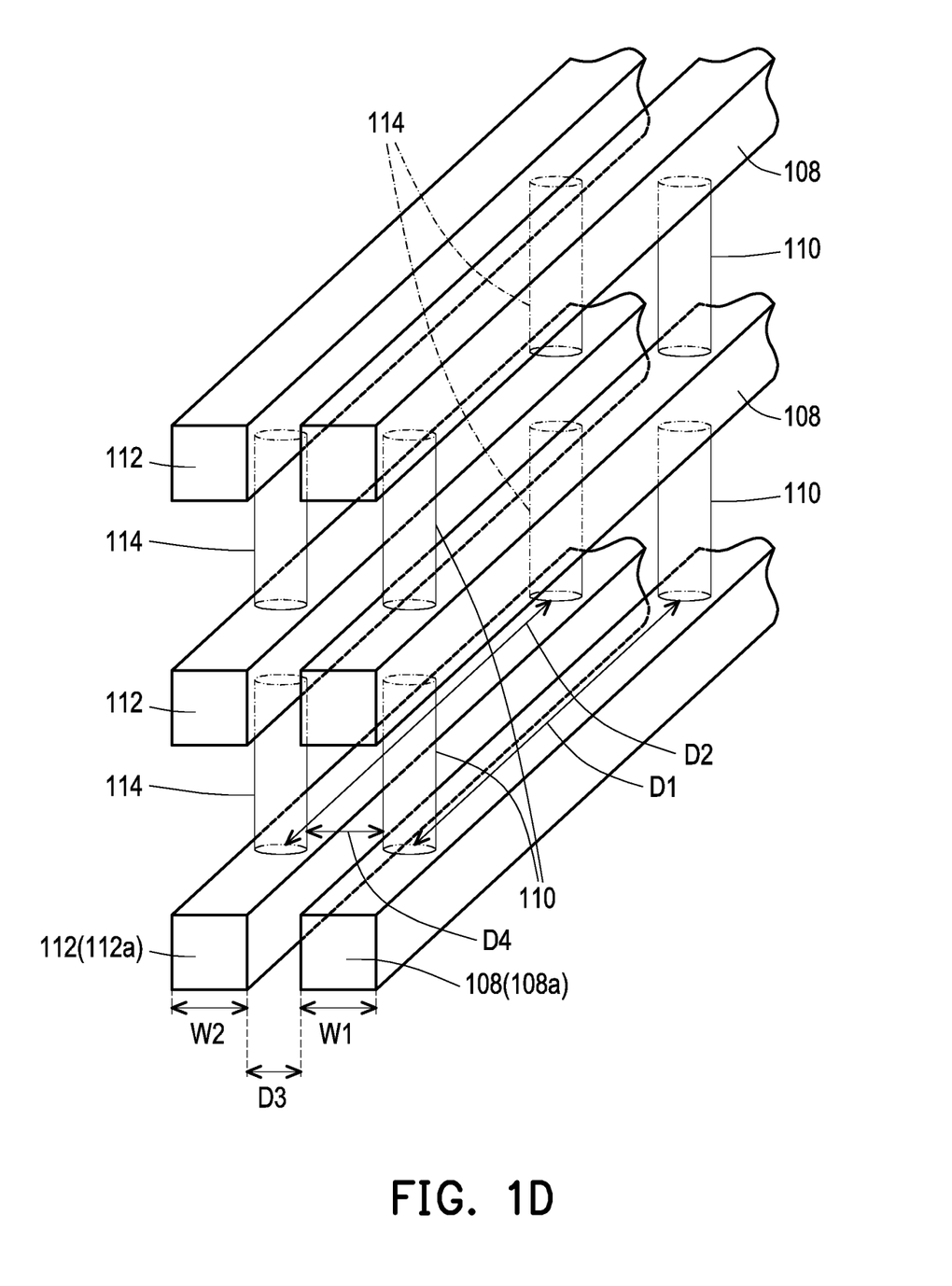
FIG. 1D is a partial perspective view of a chip crack detection ring 102 and a chip crack detection ring 104 in FIG. 1A.
Figure 1E:
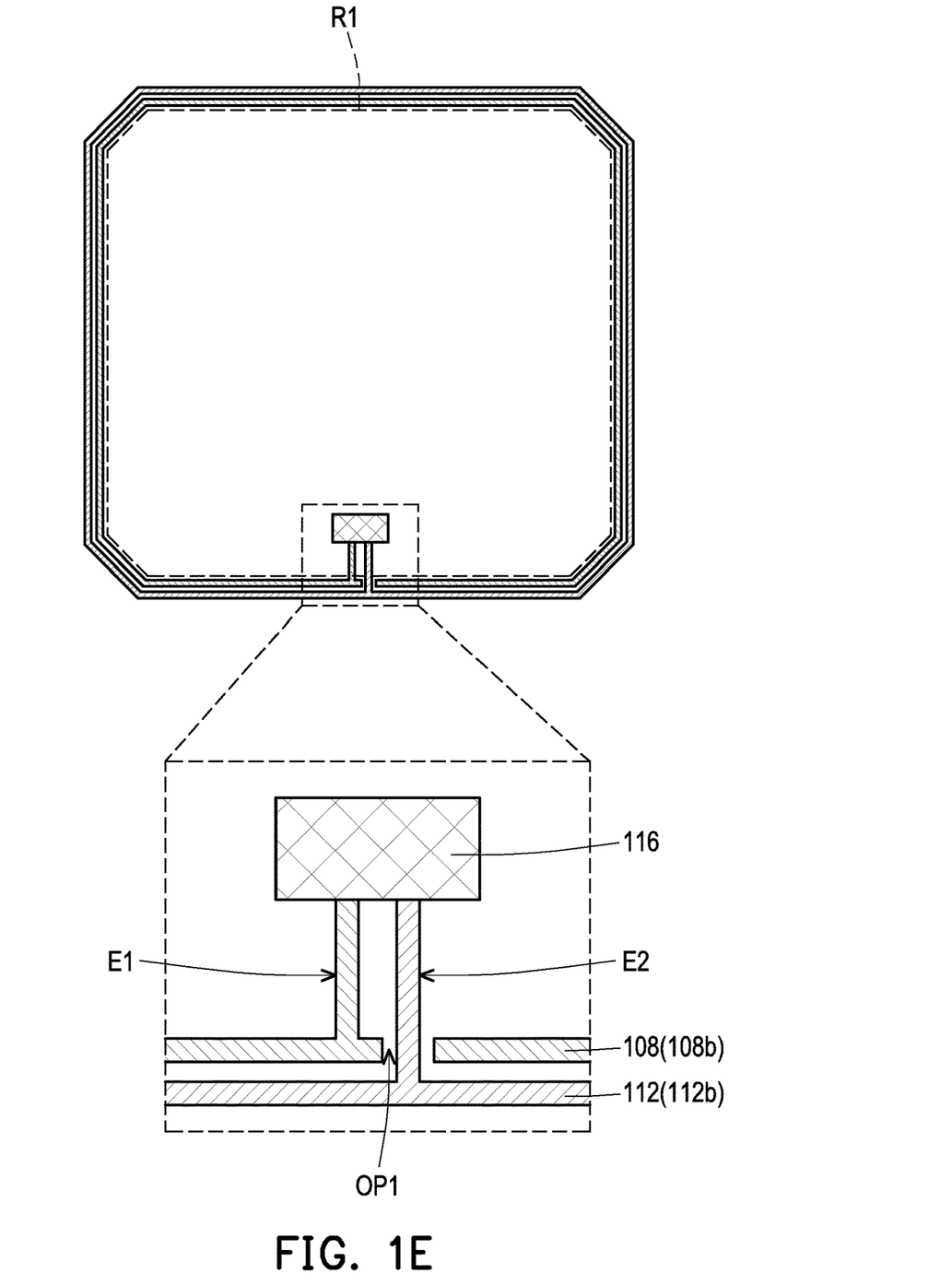
FIG. 1E is a top view of one of multiple conductive layers 108 and one of multiple conductive layers 112 in FIG. 1B and FIG. 1C.
Figure 2:
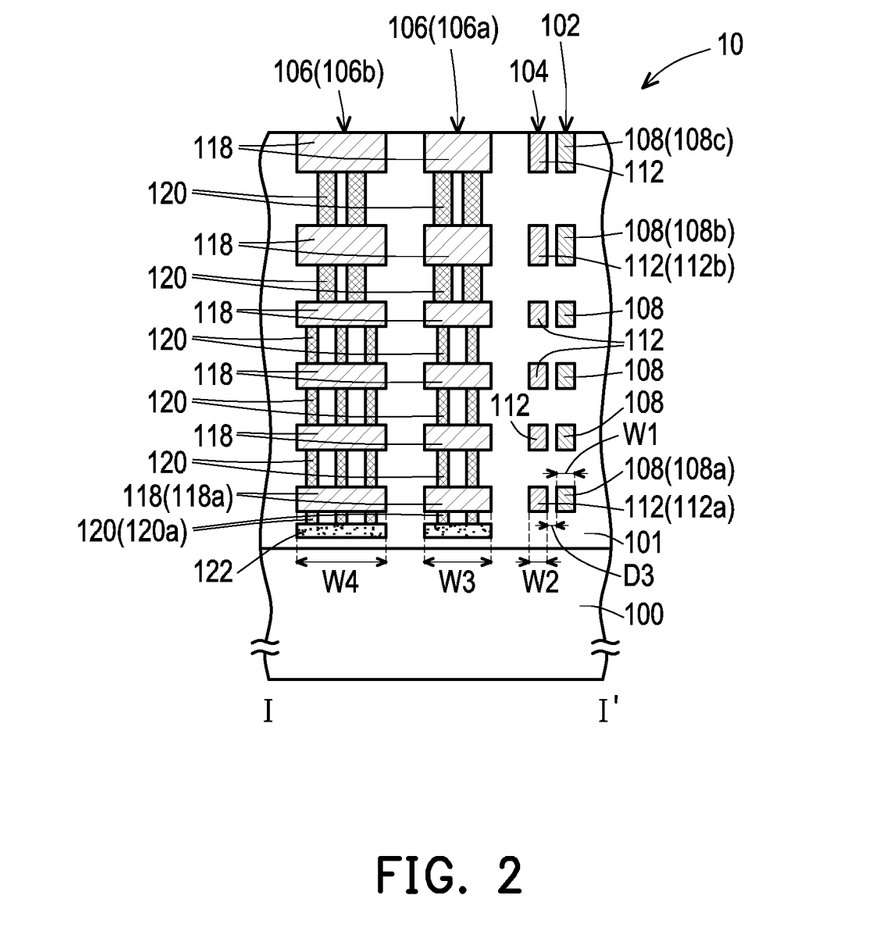
FIG. 2 is a cross-sectional view along the section line I-I' in FIG. 1A according to other embodiments of the disclosure.

FIG. 1A is a top view of a chip crack detection structure according to some embodiments of the disclosure. FIG. 1B is a cross-sectional view along a section line I-I' in FIG. 1A. FIG. 1C is a cross-sectional view along a section line II-II' and a section line III-III' in FIG. 1A. FIG. 1D is a partial perspective view of a chip crack detection ring 102 and a chip crack detection ring 104 in FIG. 1A. FIG. 1E is a top view of one of multiple conductive layers 108 and one of multiple conductive layers 112 in FIG. 1B and FIG. 1C. In FIG. 1A, FIG. 1D, and FIG. 1E, some components in FIG. 1B and FIG. 1C are omitted to clearly illustrate the configuration relationship among the components in FIG. 1A, FIG. 1D, and FIG. 1E. FIG. 2 is a cross-sectional view along the section line I-I' in FIG. 1A according to other embodiments of the disclosure.

Referring to FIG. 1A to FIG. 1C, a chip crack detection structure 10 includes a substrate 100, the chip crack detection ring 102, the chip crack detection ring 104, and a seal ring 106. The substrate 100 may be a semiconductor substrate, such as a silicon substrate. In addition, although not shown in the drawings, the substrate 100 may have required components such as a doped region and/or an isolation structure therein, and the substrate 100 may have required semiconductor elements such as an active element and/or a passive element therein and/or thereon, and the description thereof is omitted here. Furthermore, as shown in FIG. 1A, the substrate 100 may have an element region R1. For example, in the embodiment, the element region R1 may include an embedded high voltage (eHV) element region. That is, the element region R1 may include an embedded high voltage element therein, but the disclosure is not limited thereto. In other embodiments, the element region R1 may include other logic element regions.

In addition, referring to FIG. 1B and FIG. 1C, the chip crack detection structure 10 may further include a dielectric layer 101. The dielectric layer 101 is located on the substrate 100. The chip crack detection ring 102, the chip crack detection ring 104, and the seal ring 106 are located in the dielectric layer 101. In some embodiments, the dielectric layer 101 may be a multi-layer structure. The material of the dielectric layer 101 is, for example, silicon oxide, silicon nitride, or a combination thereof.

Referring to FIG. 1A, the chip crack detection ring 102 may surround the element region R1. Referring to FIG. 1B, FIG. 1C, and FIG. 1D, the chip crack detection ring 102 includes multiple conductive layers 108. The conductive layers 108 are stacked over the substrate 100 and are electrically connected to each other. A bottom surface of a lowermost conductive layer 108a among the conductive layers 108 is not in contact with any plug. In some embodiments, the chip crack detection ring 102 is not electrically connected to the substrate 100. In some embodiments, the thicknesses of the conductive layers 108 located at different heights may be the same as or different from each other. In some embodiments, a line width W1 (FIG. 1B and FIG. 1D) of the conductive layer 108 may be 1 to 3 times the minimum line width specified by the design rule. In addition, the conductive layers 108 located at different heights may have their respective design rules. In addition, the number of the conductive layers 108 is not limited to the number in the drawings. As long as the number of the conductive layers 108 is multiple, the same falls within the scope covered by the disclosure. The material of the conductive layer 108 is, for example, a conductive material such as metal (for example, copper, aluminum, or tungsten).

Referring to FIG. 1C and FIG. 1D, the chip crack detection ring 102 may further include multiple plugs 110. In some embodiments, the plug 110 may be a via plug. The conductive layers 108 and the plugs 110 are alternately stacked. The conductive layers 108 may be electrically connected to each other by the plugs 110. In some embodiments, a distance D1 between two adjacent plugs 110 located between two adjacent conductive layers 108 may be 2 μm to 16.4 μm. In some embodiments, the widths of the plugs 110 may be the same as or different from each other. In addition, the number of the plugs 110 is not limited to the number in the drawings. As long as the number of the plugs 110 is multiple, the same falls within the scope covered by the disclosure. The material of the plug 110 is, for example, a conductive material such as metal (for example, tungsten or copper).

Referring to FIG. 1A, the chip crack detection ring 104 surrounds the chip crack detection ring 102. Referring to FIG. 1B, FIG. 1C, and FIG. 1D, the chip crack detection ring 104 includes multiple conductive layers 112. The conductive layers 112 are stacked over the substrate 100 and are electrically connected to each other. A bottom surface of a lowermost conductive layer 112a among the conductive layers 112 is not in contact with any plug. In some embodiments, the chip crack detection ring 104 is not electrically connected to substrate 100. In some embodiments, the thicknesses of the conductive layers 112 at different heights may be the same as or different from each other. In some embodiments, a line width W2 (FIG. 1B and FIG. 1D) of the conductive layer 112 may be 1 to 3 times the minimum line width specified by the design rule. In addition, the conductive layers 112 located at different heights may have their respective design rules. In addition, the number of the conductive layers 112 is not limited to the number in the drawings. As long as the number of the conductive layers 112 is multiple, the same falls within the scope covered by the disclosure. The material of the conductive layer 112 is, for example, a conductive material such as metal (for example, copper, aluminum, or tungsten).

Referring to FIG. 1C and FIG. 1D, the chip crack detection ring 104 may further include multiple plugs 114. In some embodiments, the plug 114 may be a via plug. The conductive layers 112 and the plugs 114 are alternately stacked. The conductive layers 112 may be electrically connected to each other by the plugs 114. In some embodiments, a distance D2 between two adjacent plugs 114 located between two adjacent conductive layers 112 may be 2 μm to 16.4 μm. In some embodiments, the widths of the plugs 114 may be the same as or different from each other. In addition, the number of the plugs 114 is not limited to the number in the drawings. As long as the number of the plugs 114 is multiple, the same falls within the scope covered by the disclosure. The material of the plug 114 is, for example, a conductive material such as metal (for example, tungsten or copper).

In some embodiments, as shown in FIG. 1B and FIG. 1D, a minimum distance D3 between the conductive layer 108 and the conductive layer 112 is 1 to 3 times the minimum conductive layer distance specified by the design rule. In some embodiments, as shown in FIG. 1D, a minimum distance D4 (FIG. 1D) between the plug 110 and the plug 114 may be 1 to 3 times the minimum plug distance specified by the design rule.

Referring to FIG. 1A and FIG. 1E, the chip crack detection structure 10 may further include a chip crack detection circuit 116. In the embodiment, the chip crack detection circuit 116 may be located in the element region R1 (that is, the chip crack detection circuit 116 may be located inside the chip), but the disclosure is not limited thereto. In other embodiments, the chip crack detection circuit 116 may be located outside the chip.

Referring to FIG. 1A and FIG. 1E, the chip crack detection ring 102 and the chip crack detection ring 104 may be electrically connected to the chip crack detection circuit 116. Referring to FIG. 1A, FIG. 1B, and FIG. 1E, one of the conductive layers 108 (for example, a conductive layer 108b) may have an extension E1, and one of the conductive layers 112 (for example, a conductive layer 112b) may have an extension E2. In addition, the extension E1 and the extension E2 may extend into the element region R1. In the embodiment, the chip crack detection circuit 116 may be located in the element region R1, the chip crack detection ring 102 may be electrically connected to the chip crack detection circuit 116 by the extension E1 of the conductive layer 108 (for example, the conductive layer 108b), and the chip crack detection ring 104 may be electrically connected to the chip crack detection circuit 116 by the extension E2 of the conductive layer 112 (for example, the conductive layer 112b). In other embodiments, when the chip crack detection circuit 116 is located outside the chip, the chip crack detection ring 102 may be electrically connected to the chip crack detection circuit 116 by the extension E1 of the conductive layer 108 and other interconnect structures (not shown), and the chip crack detection ring 104 may be electrically connected to the chip crack detection circuit 116 by the extension E2 of the conductive layer 112 and other interconnect structures (not shown).

Furthermore, the conductive layer 108 with the extension E1 may be any layer of the conductive layers 108, and the conductive layer 112 with the extension E2 may be any layer of the conductive layers 112. In the embodiment, the conductive layer 108 with the extension E1 is the conductive layer 108b, and the conductive layer 112 with the extension E2 is the conductive layer 112b, but the disclosure is not limited thereto. In addition, in the embodiment, the conductive layer 108 (for example, the conductive layer 108b) with the extension E1 and the conductive layer 112 (for example, the conductive layer 112b) with the extension E2 may have the same height, but the disclosure is not limited thereto. In other embodiments, the conductive layer 108 with an extension and the conductive layer 112 with an extension may have different heights. For example, when the conductive layer 108 with the extension is the lowermost conductive layer 108a, and the conductive layer 112 with the extension is the conductive layer 112b, the conductive layer 108 (for example, the lowermost conductive layer 108a) with the extension and the conductive layer 112 (for example, the conductive layer 112b) with the extension may have different heights.

Referring to FIG. 1E, one of the conductive layers 108 (for example, the conductive layer 108b) may have a discontinuous structure and may have an opening OP1, and one of the conductive layers 112 (for example, the conductive layer 112b) may have the extension E2. The extension E2 passes through the opening OP1 and extends into the element region R1. The conductive layer 108 (for example, the conductive layer 108b) with the opening OP1 and the conductive layer 112 (for example, the conductive layer 112b) with the extension E2 may have the same height. In the embodiment, one of the conductive layers 108 (for example, the conductive layer 108b) may have a discontinuous structure and may have the opening OP1, and the remaining conductive layers 108 (for example, an uppermost conductive layer 108c in FIG. 1A) may have a continuous structure, but the disclosure is not limited thereto. In other embodiments, some of the conductive layers 108 may have discontinuous structures and may have openings, and the remaining conductive layers 108 may have continuous structures. As long as at least one of the conductive layers 108 has a discontinuous structure and has an opening, the same falls within the scope covered by the disclosure. In some embodiments, the conductive layers 112 may respectively have continuous structures or discontinuous structures. In the embodiment, the conductive layers 112 may respectively have continuous structures, but the disclosure is not limited thereto.

Referring to FIGS. 1A and 1B, the seal ring 106 surrounds the chip crack detection ring 104. The chip crack detection ring 104 is located between the chip crack detection ring 102 and the seal ring 106. Referring to FIG. 1B, the seal ring 106 includes multiple conductive layers 118. The conductive layers 118 are stacked over the substrate 100 and are electrically connected to each other. In some embodiments, the thicknesses of the conductive layers 108 at different heights may be the same as or different from each other. In the embodiment, the element region R1 may be an embedded high voltage element region, the seal ring 106 may be electrically connected to the substrate 100, and the seal ring 106 may be electrically connected to a negative voltage source. In some embodiments, the seal ring 106 may be electrically connected to the negative voltage source by the substrate 100. In addition, the number of the conductive layers 118 is not limited to the number in the drawings. As long as the number of the conductive layers 118 is multiple, the same falls within the scope covered by the disclosure. The material of the conductive layer 118 is, for example, a conductive material such as metal (for example, copper, aluminum, or tungsten).

Referring to FIG. 1B, the seal ring 106 may further include multiple plugs 120. The conductive layers 118 and the plugs 120 are alternately stacked. The conductive layers 118 are electrically connected to each other by the plugs 120. In some embodiments, a bottom surface of a lowermost conductive layer 118a among the conductive layers 118 may be in contact with a lowermost plug 120a among the plugs 120. The lowermost plug 120a among the plugs 120 may be electrically connected to the substrate 100. In some embodiments, the seal ring 106 may be electrically connected to the substrate 100 by the lowermost conductive layer 118a. In some embodiments, the plug 120 located between two adjacent conductive layers 118 may be a via plug, and the lowermost plug 120a may be a contact plug. In some embodiments, the widths of the plugs 120 may be the same as or different from each other. In addition, the number of the plugs 120 is not limited to the number in the drawings. As long as the number of the plugs 120 is multiple, the same falls within the scope covered by the disclosure. The material of the plug 120 is, for example, a conductive material such as metal (for example, tungsten or copper).

In the embodiment, as shown in FIG. 1A and FIG. 1B, the chip crack detection structure 10 may include two seal rings 106 (that is, a seal ring 106a and a seal ring 106b), and the seal ring 106b may surround the seal ring 106a. The seal ring 106a may be located between the chip crack detection ring 104 and the seal ring 106b. The seal ring 106a and the seal ring 106b may be separated from each other. Referring to FIG. 1B, a width W3 of the seal ring 106a and a width W4 of the seal ring 106b may be the same or different. In the embodiment, the width W3 of the seal ring 106a and the width W4 of the seal ring 106b may be different. For example, the width W3 of the seal ring 106a may be less than the width W4 of the seal ring 106b, but the disclosure is not limited thereto. In the embodiment, although the number of the seal rings 106 is two, the disclosure is not limited thereto. As long as the number of the seal rings 106 is at least one, the same falls within the scope covered by the disclosure.

In other embodiments, as shown in FIG. 2, the seal ring 106 may also not be electrically connected to the substrate 100. In FIG. 2, the lowermost plug 120a among the plugs 120 may be electrically connected to a gate layer 122. The gate layer 122 is located between the lowermost plug 120a among the plugs 120 and the substrate 100. In addition, the gate layer 122 may be located in the dielectric layer 101. The material of the gate layer 122 may include doped polysilicon, metal, or a metal compound. In some embodiments, the gate layer 122 is not electrically connected to the substrate 100. In other embodiments, the same seal ring 106 may also be electrically connected to the substrate 100 and the gate layer 122 at the same time.

Based on the above embodiments, the chip crack detection structure 10 includes the chip crack detection ring 102 and the chip crack detection ring 104, the bottom surface of the lowermost conductive layer 108a among the conductive layers 108 of the chip crack detection ring 102 is not in contact with any plug, and the bottom surface of the lowermost conductive layer 112a among the conductive layers 112 of the chip crack detection ring 104 is not in contact with any plug. Therefore, the chip crack detection structure 10 may monitor whether the dielectric layer 101 in the chip is cracked by measuring the capacitance between the chip crack detection ring 102 and the chip crack detection ring 104, so that the sensitivity and lifetime of the chip crack detection structure 10 can be increased, and the circuit complexity and footprint of the chip crack detection structure 10 can be reduced.

In summary, in the chip crack detection structure of the foregoing embodiment, the chip crack detection structure may monitor whether the dielectric layer in the chip is cracked by measuring the capacitance between two adjacent chip crack detection rings. Therefore, the sensitivity and lifetime of the chip crack detection structure can be increased, and the circuit complexity and footprint of the chip crack detection structure can be reduced.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:
1. A chip crack detection structure, comprising:
a substrate;
a first chip crack detection ring, comprising a plurality of first conductive layers, wherein the first conductive layers are stacked over the substrate and are electrically connected to each other, and a bottom surface of a lowermost conductive layer among the first conductive layers is not in contact with any plug;
a second chip crack detection ring, surrounding the first chip crack detection ring and comprising a plurality of second conductive layers, wherein the second conductive layers are stacked over the substrate and are electrically connected to each other, and a bottom surface of a lowermost conductive layer among the second conductive layers is not in contact with any plug; and
a seal ring, surrounding the second chip crack detection ring and comprising a plurality of third conductive layers, wherein the third conductive layers are stacked over the substrate and are electrically connected to each other,
wherein the seal ring is electrically connected to the substrate,
wherein the first chip crack detection ring is not electrically connected to the second chip crack detection ring.
2. The chip crack detection structure according to claim 1, further comprising:

a dielectric layer, located on the substrate, wherein the first chip crack detection ring, the second chip crack detection ring, and the seal ring are located in the dielectric layer.

3. The chip crack detection structure according to claim 1, wherein the first chip crack detection ring and the second chip crack detection ring are not electrically connected to the substrate.

4. The chip crack detection structure according to claim 1, wherein:
   the first chip crack detection ring further comprises:
      a plurality of first plugs, wherein the first conductive layers and the first plugs are alternately stacked, and the first conductive layers are electrically connected to each other by the first plugs, and
   the second chip crack detection ring further includes:
      a plurality of second plugs, wherein the second conductive layers and the second plugs are alternately stacked, and the second conductive layers are electrically connected to each other by the second plugs.

5. The chip crack detection structure according to claim 4, wherein a distance between adjacent two of the first plugs located between adjacent two of the first conductive layers is 2 μm to 16.4 μm.

6. The chip crack detection structure according to claim 4, wherein a distance between adjacent two of the second plugs located between adjacent two of the second conductive layers is 2 μm to 16.4 μm.

7. The chip crack detection structure according to claim 4, wherein a minimum distance between the first plug and the second plug is 1 to 3 times a minimum plug distance specified by a design rule.

8. The chip crack detection structure according to claim 1, wherein a line width of the first conductive layer is 1 to 3 times a minimum line width specified by the design rule.

9. The chip crack detection structure according to claim 1, wherein a line width of the second conductive layer is 1 to 3 times a minimum line width specified by the design rule.

10. The chip crack detection structure according to claim 1, wherein a minimum distance between the first conductive layer and the second conductive layer is 1 to 3 times a minimum conductive layer distance specified by a design rule.

11. The chip crack detection structure according to claim 1, wherein the seal ring further comprises:
   a plurality of plugs, wherein the third conductive layers and the plugs are alternately stacked, and the third conductive layers are electrically connected to each other by the plugs.

12. The chip crack detection structure according to claim 11, wherein a bottom surface of a lowermost conductive layer among the third conductive layers is in contact with a lowermost plug among the plugs.

13. The chip crack detection structure according to claim 12, wherein the lowermost plug among the plugs is electrically connected to the substrate.

14. The chip crack detection structure according to claim 12, wherein the lowermost plug among the plugs is electrically connected to a gate layer, and the gate layer is located between the lowermost plug among the plugs and the substrate.

15. The chip crack detection structure according to claim 1, wherein the substrate has an element region, and the first chip crack detection ring surrounds the element region.

16. The chip crack detection structure according to claim 15, wherein the element region comprises an embedded high voltage element region.

17. The chip crack detection structure according to claim 16, wherein the seal ring is electrically connected to a negative voltage source.

18. The chip crack detection structure according to claim 15, wherein:
   one of the first conductive layers has a discontinuous structure and has an opening, and
   one of the second conductive layers has an extension, wherein the extension passes through the opening and extends into the element region.

19. The chip crack detection structure according to claim 1, further comprising:
   a chip crack detection circuit, wherein the first chip crack detection ring and the second chip crack detection ring are electrically connected to the chip crack detection circuit.

* * * * *